(12) United States Patent
Chang et al.

(10) Patent No.: US 11,895,772 B2
(45) Date of Patent: Feb. 6, 2024

(54) INTERLAYER CONNECTIVE STRUCTURE OF WIRING BOARD AND METHOD OF MANUFACTURING THE SAME

(71) Applicant: Unimicron Technology Corp., Taoyuan (TW)

(72) Inventors: Chi-Min Chang, Taoyuan (TW); Ching-Sheng Chen, Hsinchu County (TW); Jun-Rui Huang, Tainan (TW); Wei-Yu Liao, Taoyuan (TW); Yi-Pin Lin, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 267 days.

(21) Appl. No.: 17/377,280

(22) Filed: Jul. 15, 2021

(65) Prior Publication Data

US 2022/0386460 A1    Dec. 1, 2022

(30) Foreign Application Priority Data

Jun. 1, 2021    (TW) .................................. 110119894

(51) Int. Cl.
*H05K 1/11* (2006.01)
*H05K 3/42* (2006.01)
*H05K 1/18* (2006.01)

(52) U.S. Cl.
CPC ............ *H05K 1/115* (2013.01); *H05K 1/181* (2013.01); *H05K 3/423* (2013.01); *H05K 2201/09545* (2013.01)

(58) Field of Classification Search
CPC ........ H05K 1/115; H05K 1/116; H05K 1/181; H05K 2201/09545; H05K 2201/09818; H05K 2201/09827; H05K 2201/09836; H05K 2201/09845; H05K 2201/09854; H05K 2201/09727; H05K 2201/09736; H05K 2201/09645; H05K 2201/09145–0919; H05K 3/423
See application file for complete search history.

(56) References Cited

U.S. PATENT DOCUMENTS

| | | | |
|---|---|---|---|
| 2008/0169124 A1 | 7/2008 | Zhang | |
| 2009/0122498 A1* | 5/2009 | Lan ........................ | H05K 1/115 361/778 |
| 2020/0253050 A1* | 8/2020 | Tuominen ............ | H05K 1/0213 |
| 2020/0253052 A1* | 8/2020 | Ifis ......................... | H05K 3/427 |

FOREIGN PATENT DOCUMENTS

| | | |
|---|---|---|
| CN | 105682350 A | 6/2016 |
| TW | 201742523 A | 12/2017 |

\* cited by examiner

*Primary Examiner* — Roshn K Varghese
(74) *Attorney, Agent, or Firm* — CKC & Partners Co., LLC

(57) ABSTRACT

An interlayer connective structure is suitable for being formed in a wiring board, in which the wiring board includes two traces and an insulation part between the traces. The insulation part has a through hole. The interlayer connective structure located in the through hole is connected to the traces. The interlayer connective structure includes a column and a pair of protuberant parts. The protuberant parts are located at two ends of the through hole respectively and connected to the column and the traces. The protuberant parts stick out from the outer surfaces of the traces respectively. Each of the protuberant parts has a convex curved surface, in which the distance between the convex curved surface and the axis of the through hole is less than the radius of the through hole.

8 Claims, 13 Drawing Sheets

INTERLAYER CONNECTIVE STRUCTURE OF WIRING BOARD AND METHOD OF MANUFACTURING THE SAME

CROSS-REFERENCE TO RELATED APPLICATION

This application claims priority to Taiwan Application Ser. No. 110119894, filed Jun. 1, 2021, which is herein incorporated by reference in its entirety.

BACKGROUND

Technical Field

The present disclosure relates to a wiring board and a method of manufacturing the same. More particularly, the present disclosure relates to an interlayer connective structure and a manufacturing method thereof.

Description of Related Art

Most conventional multilayer wiring board have at least one through hole, at least one conductive through hole structure, and a plurality of wiring layers apiece. The conductive through hole structure is formed in the through hole, where two ends of the conductive through hole structure are connected to two non-coplanar wiring layers respectively, so that the two wiring layers are electrically connected to each other. The interconnection between the conductive through hole structure and the wiring layer, i.e., the part of the conductive through hole structure near either end of the through hole, has a fragile structure and thus sometimes forms a crack, so as to reduce the reliability, thereby resulting in a possible defect, such as broken circuit, between the conductive through hole structure and the wiring layer.

SUMMARY

At least one embodiment of the disclosure provides an interlayer connective structure of wiring board, so as to enhance the structure of the interconnection between the conductive through hole structure and the wiring layer.

At least one embodiment of the disclosure provides a method of manufacturing the abovementioned interlayer connective structure of wiring board.

An interlayer connective structure according to at least one embodiment of the disclosure is suitable for being formed in the wiring board, where the wiring board includes two traces and an insulation part between the traces. The insulation part has a through hole, and the interlayer connective structure is located in the through hole and connected to the traces. The interlayer connective structure includes a column and a pair of protuberant parts. The column is located in the through hole and has two opposite end faces. The protuberant parts are connected to the end faces and the traces respectively and located at two ends of the through hole respectively, in which each of the traces has an inner surface connected to the insulation part and an outer surface away from the insulation part, and the protuberant parts stick out from the outer surfaces of the traces. Each of the protuberant parts has a convex curved surface, where the distance between the convex curved surface and an axis of the through hole is less than a radius of the through hole.

Method of manufacturing an interlayer connective structure of a wiring board according to at least one embodiment of the disclosure includes the following steps. First, a wiring substrate is provided, in which the wiring substrate includes two initial traces and an insulation part between the initial traces. Afterwards, a through hole is formed in the wiring substrate, in which the through hole extends from one of the initial traces to the other initial trace. Two patterned cover layers are formed, in which the wiring substrate is located between the patterned cover layers, and the patterned cover layers cover two end edges of the through hole without covering the initial traces. The patterned cover layers have two openings respectively, and the openings and the through hole communicate. Afterwards, by using the patterned cover layers as masks, an electroplating process is performed to the wiring substrate and the through hole. After the electroplating process is performed, the patterned cover layers are removed.

Based on the above, the protuberant parts at two ends of the through hole stick out from the outer surfaces of the traces respectively, and the distance between the convex curved surface of each of the protuberant parts and the axis of the through hole is less than the radius of the through hole, so that the protuberant parts of the interlayer connective structure has a significantly thickness apiece, so as to enhance the structure of the interconnection between the interlayer connective structure and each trace, thereby reducing or preventing the crack occurring.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
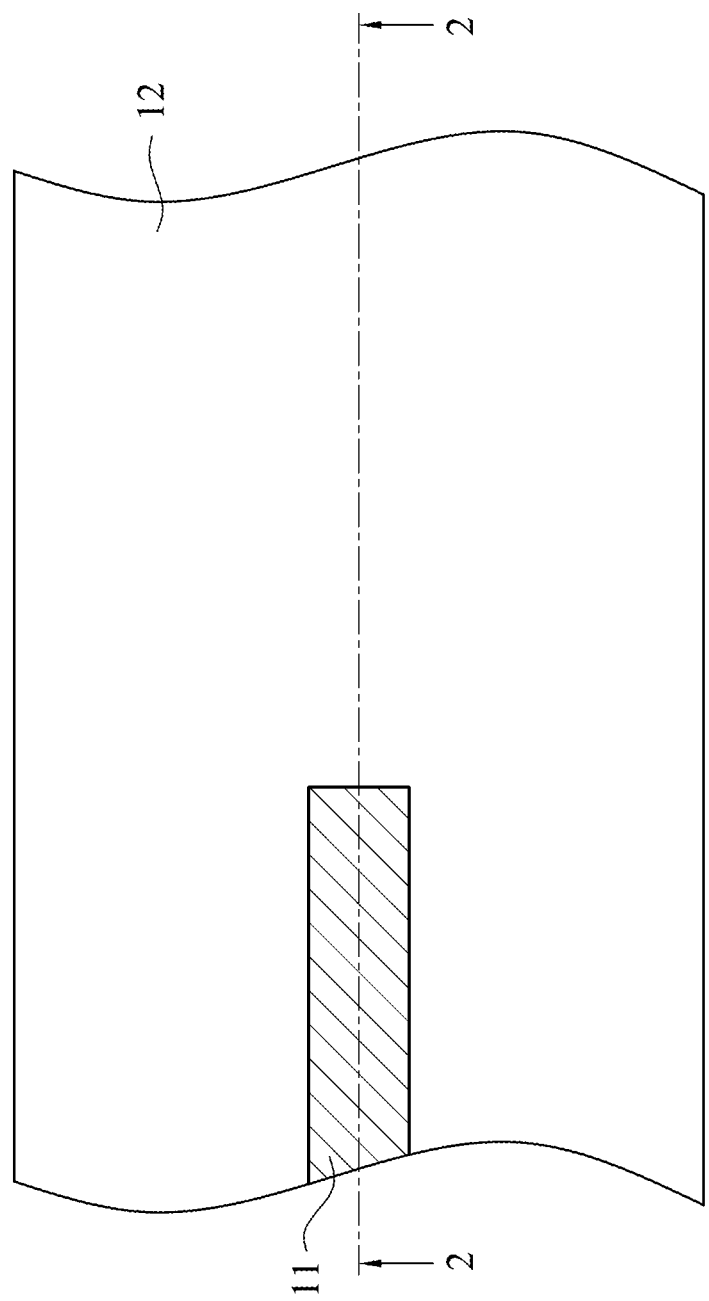
FIGS. 1 to 9 are schematic views of a method of manufacturing an interlayer connective structure of a wiring board according to at least one embodiment of the disclosure.

In the following description, in order to clearly present the technical features of the present disclosure, the dimensions (such as length, width, thickness, and depth) of elements (such as layers, films, substrates, and areas) in the drawings will be enlarged in unusual proportions. Accordingly, the description and explanation of the following embodiments are not limited to the sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 2:
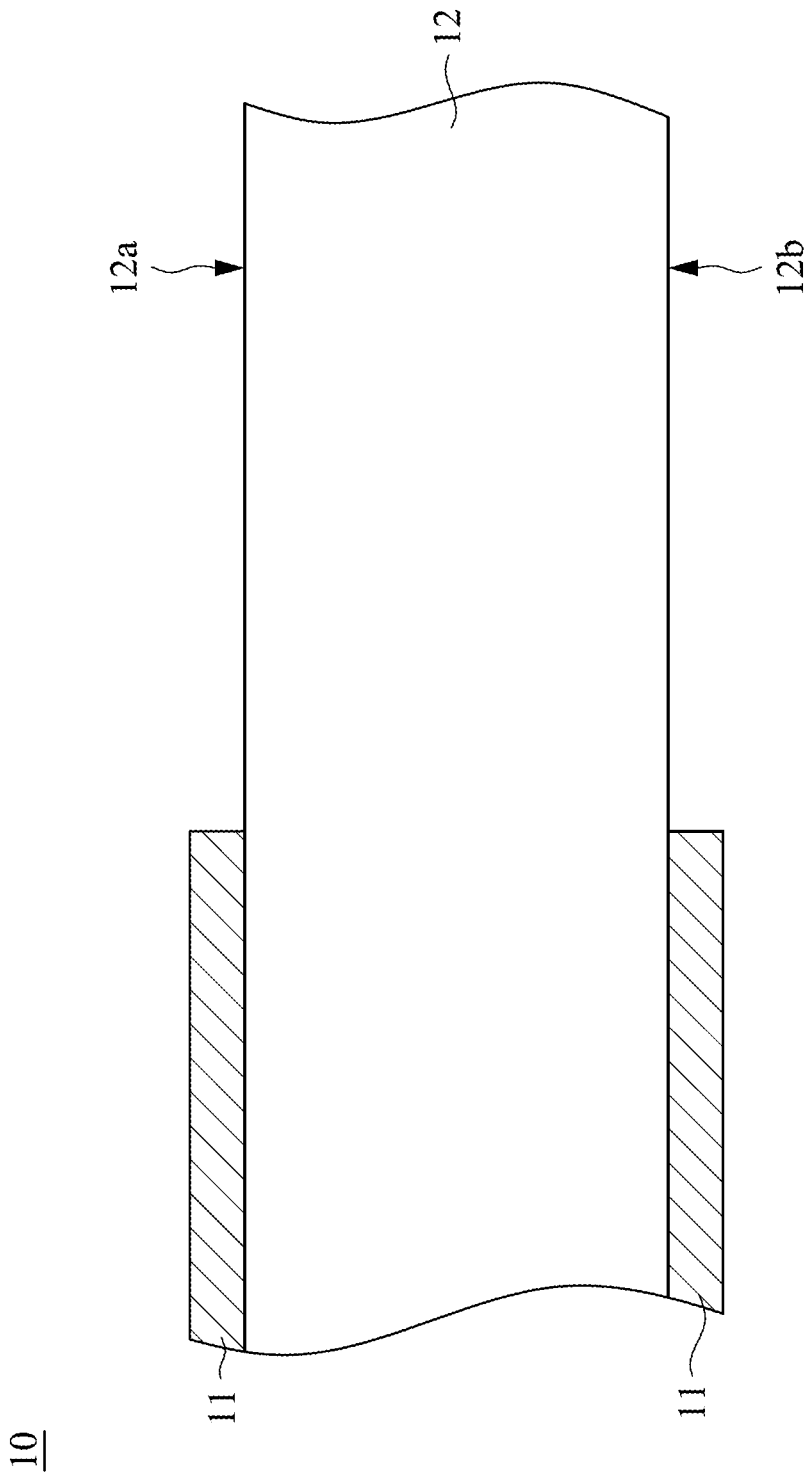

FIGS. 1 to 9 are schematic views of a method of manufacturing an interlayer connective structure of a wiring board according to at least one embodiment of the disclosure. Referring to FIGS. 1 and 2, in the method of manufacturing according to the present embodiment, first, a wiring substrate 10 is provided, in which FIG. 1 is a schematic top view of the wiring substrate 10, whereas FIG. 2 is a schematic cross-sectional view along a line 2-2 in FIG. 1. The wiring substrate 10 is substantially a wiring board and has at least two wiring layers.

In the embodiment, the wiring substrate 10 is substantially a double-sided wiring board and has two wiring layers, where each of the wiring layers includes at least one trace. Taking FIG. 2 for example, the wiring substrate 10 includes two non-coplanar wiring layers, and each of the wiring layers includes an initial trace 11, where the insulation part 12 is located between two of the wiring layers. That is, the insulation part 12 is located between two initial traces 11.

In other embodiment, the wiring substrate 10 may be substantially a multilayer wiring board have more than two wiring layers, in which at least one wiring layer can be located in the insulation part 12. Specifically, the insulation part 12 can include a plurality of insulation layers (not shown) in a stack, and at least one wiring layer can be sandwiched between adjacent two insulation layers. The insulation layer may be made of ceramic material or resin, such as prepreg.

In particular, when the wiring substrate 10 has more than two wiring layers, the wiring substrate can further include at least one conductive blind via structure (not shown). The conductive blind via structure is disposed in the insulation part 12 and connected to two adjacent wiring layers, so that the two adjacent wiring layers can be electrically connected to each other through the conductive blind via structure. In addition, each of the wiring layers can further include at least one pad (not shown). The pad can be used for mounting an electronic component, and least one initial trace 11 can be connected to at least one pad.

Since the wiring substrate 10 can have more than two wiring layers, the quantity of the wiring layers which the wiring substrate 10 has can be three or more than three, and not be limited to two. In addition, in other embodiment, each of the wiring layers can include a plurality of traces. Thus, even if the wiring substrate 10 is substantially a double-sided wiring board having two wiring layers, the wiring substrate 10 can include two or more than two initial traces 11, in which at least two initial traces 11 can be disposed on the upper surface 12a or the lower surface 12b of the insulation part 12.

Figure 3:
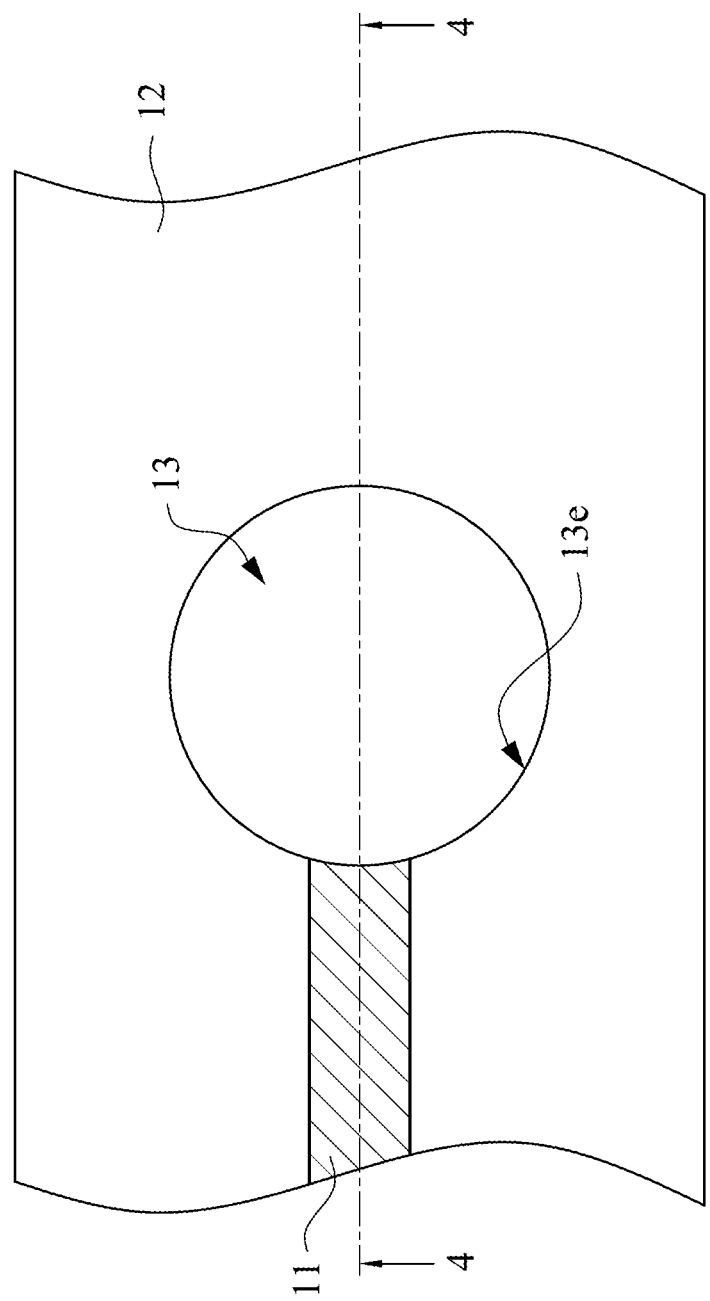
Figure 4:
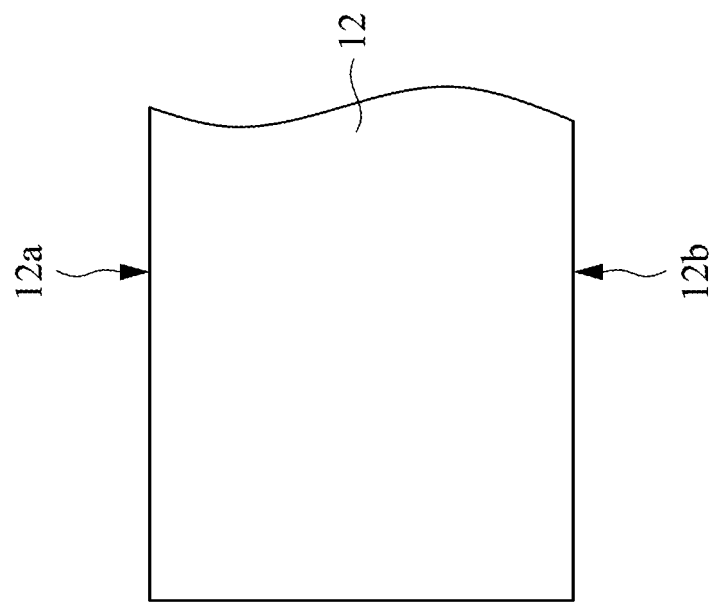
Figure 4:
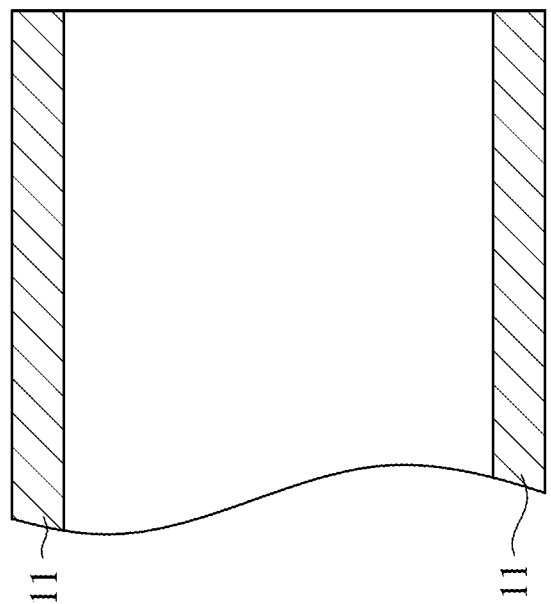

Referring to FIGS. 3 and 4, FIG. 3 is a schematic top view of the wiring substrate 10, whereas FIG. 4 is a schematic cross-sectional view along a line 4-4 in FIG. 3. Then, at least one through hole 13 is formed in the wiring substrate 10, in which forming the through hole 13 can be laser drilling or mechanical drilling. It is noted that FIGS. 3 and 4 illustrate one through hole 13 apiece, but a plurality of the through holes 13 can be formed in other embodiment. Hence, FIGS. 3 and 4 are not limited to the quantity of the through hole 13.

The through hole 13 is formed by passing through the wiring substrate 10, where the through hole 13 extends from one of the initial traces 11 (e.g., the initial trace 11 on the upper surface 12a) to the other initial trace 11 (e.g., the initial trace 11 on the lower surface 12b) and is formed inside the insulation part 12. Hence, the insulation part 12 has at least one through hole 13 which both the upper surface 12a and the lower surface 12b expose. In addition, during the process of forming the through hole 13, not only the part of insulation part 12 can be removed, but also the part of each of the initial traces 11 can be removed.

Figure 5:
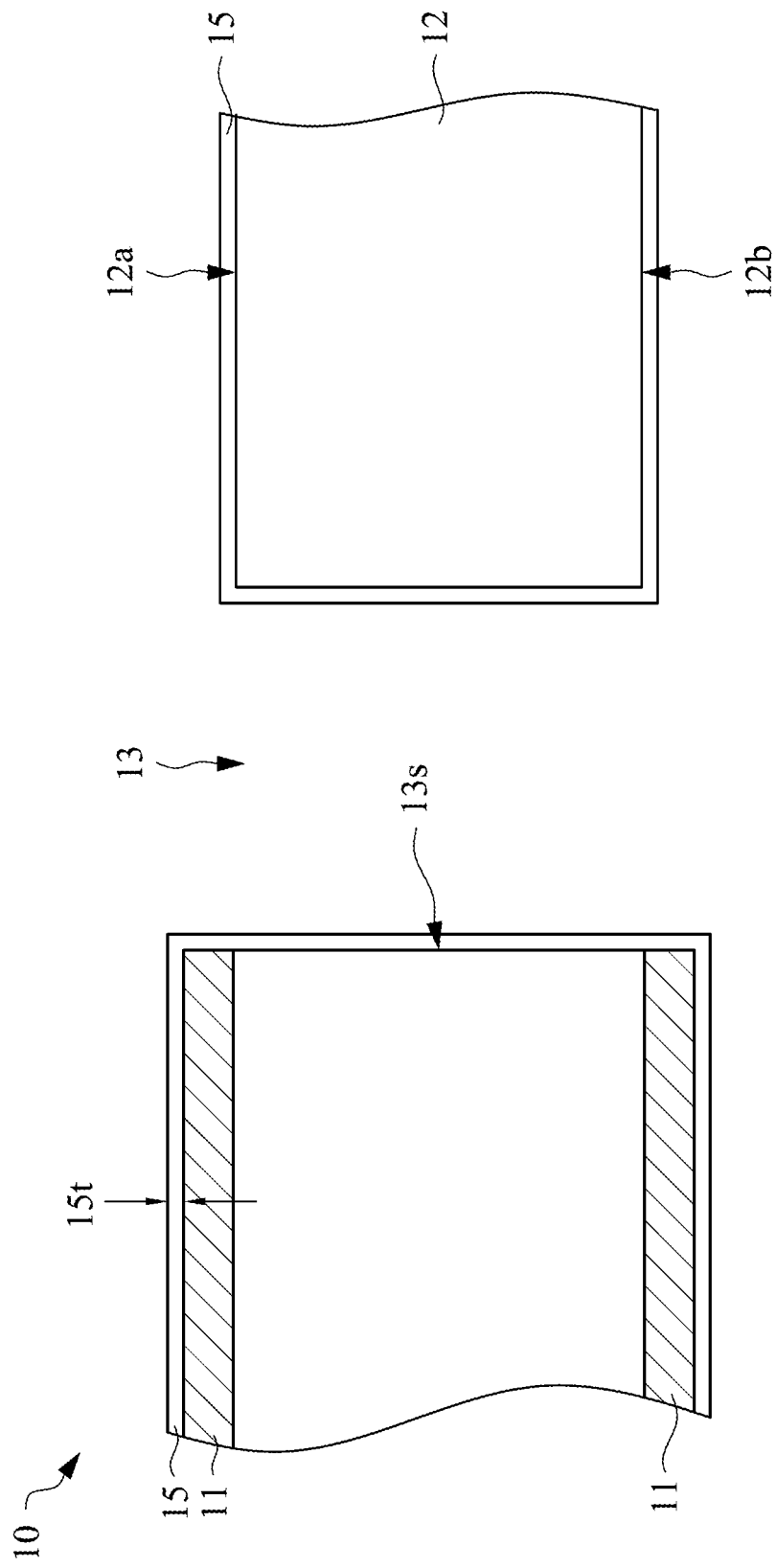

Referring to FIG. 5, FIG. 5 is a schematic cross-sectional view according to FIG. 4. After the through hole 13 is formed, a seed layer 15 is formed on the wiring substrate 10 and in the through hole 13, where the seed layer 15 comprehensively covers the wiring substrate 10 and the through hole 13. Specifically, the through hole 13 has a sidewall 13s, and the seed layer 15 comprehensively covers the initial traces 11, both the upper surface 12a and the lower surface 12b of the insulation part 12, and the sidewall 13s. The seed layer 15 can be formed by electroless plating or physical vapor deposition (PVD), where PVD is such as sputtering or evaporation. In addition, the seed layer 15 has a significantly thin thickness 15t, which ranges between 0.2 μm and 1.2 μm, for example.

Figure 6:
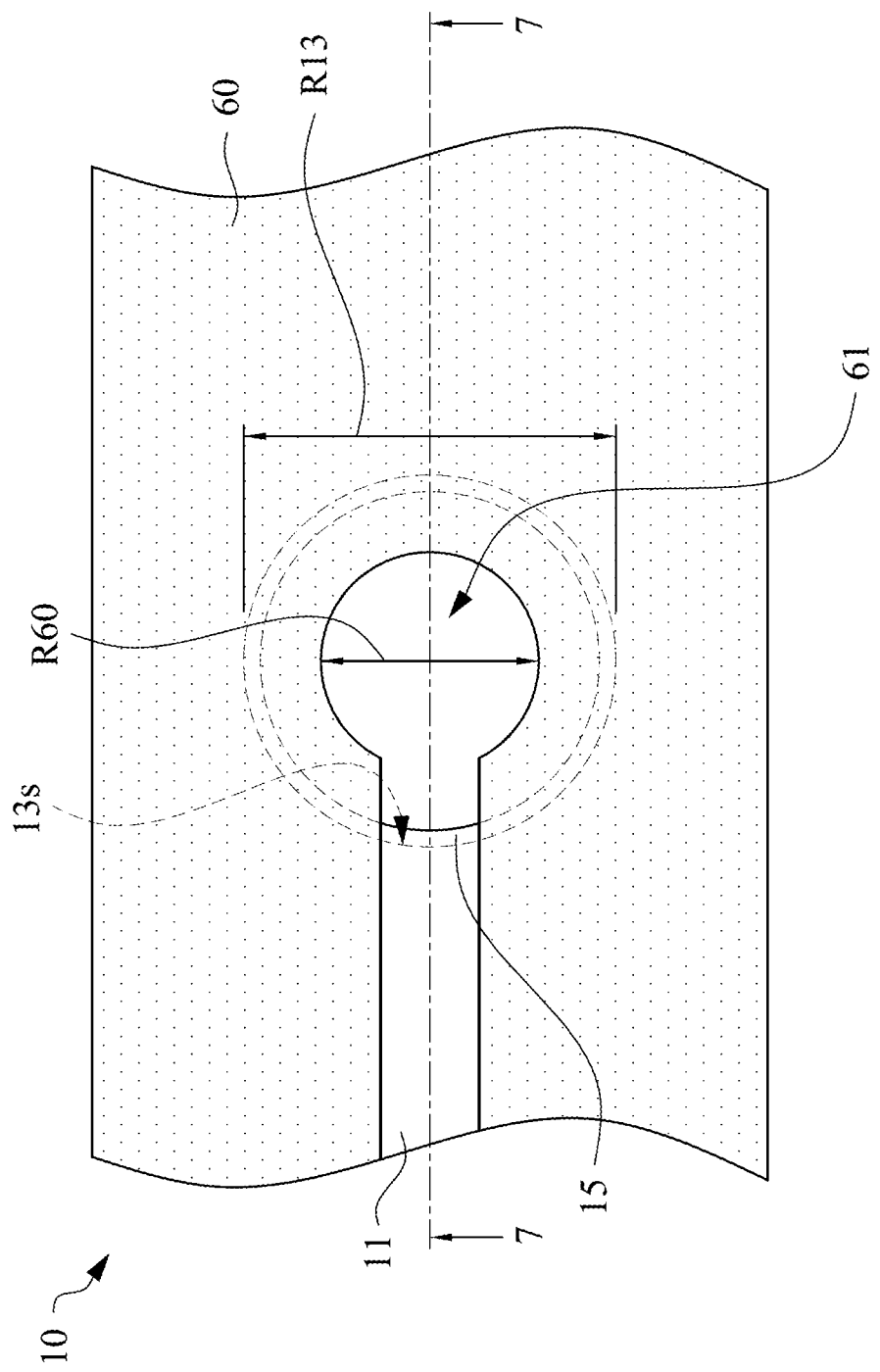
Figure 7:
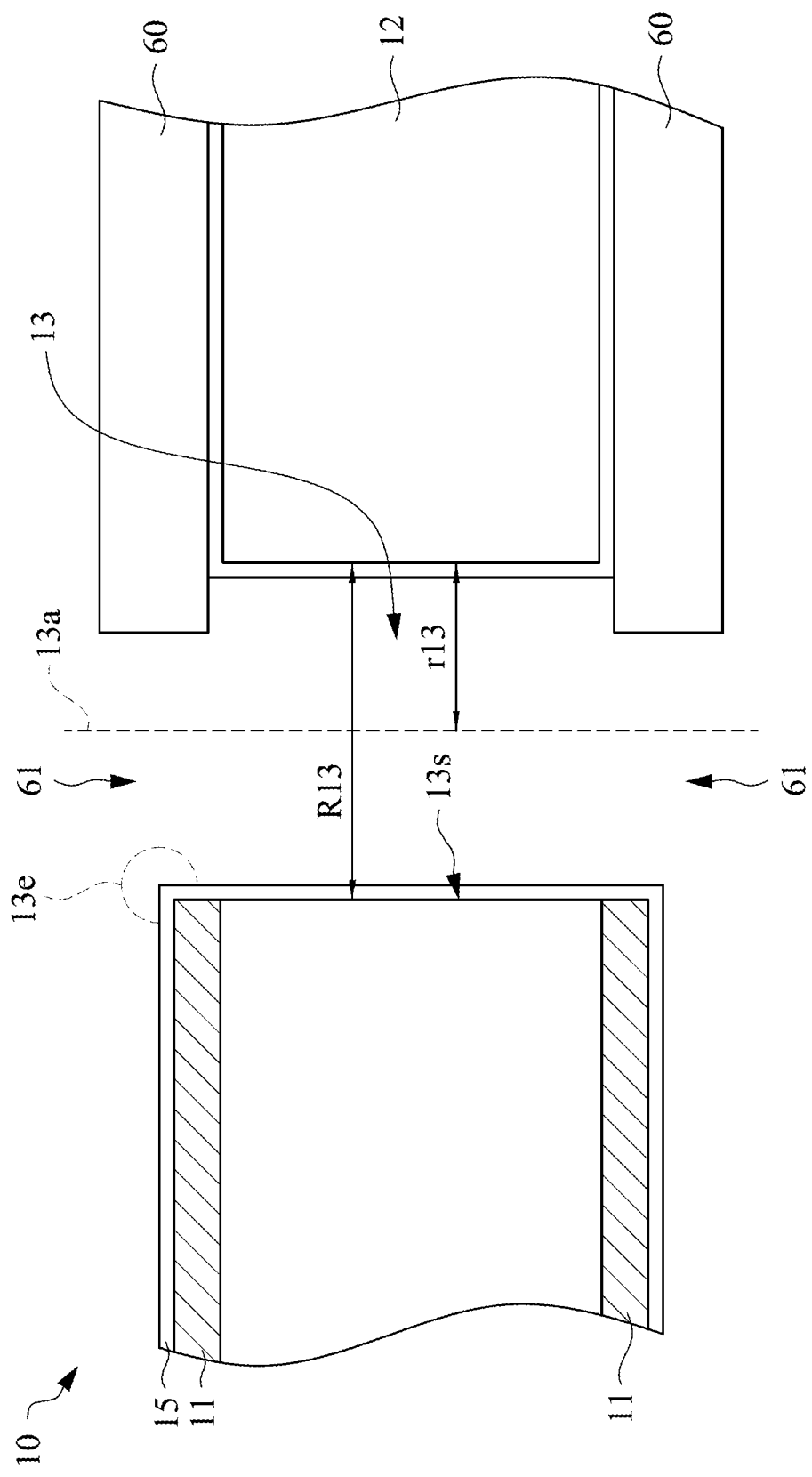

Referring to FIGS. 6 and 7, next, two patterned cover layers 60 are formed. The patterned cover layers 60 covers two opposite sides of the wiring substrate 10, in which FIG. 6 is a schematic top view of the wiring substrate 10 covered by the patterned cover layer 60, whereas FIG. 7 is a schematic cross-sectional view along a line 7-7 in FIG. 6. The wiring substrate 10 is disposed between the patterned cover layers 60, and the patterned cover layers 60 may not cover the initial traces 11.

The patterned cover layers 60 have two openings 61 respectively, that is, the patterned cover layers 60 have an opening 61 apiece, where the openings 61 are aligned with the through hole 13, so that the openings 61 and the through hole 13 can communicate. In the embodiment, the diameter R60 of the opening 61 is less than the diameter R13 of the through hole 13, so that the patterned cover layers 60 can cover two end edges 13e (referring to FIG. 3) of the through hole 13. Since the patterned cover layers 60 can not cover the initial traces 11, the portions of the end edges 13 at the initial traces 11 are not covered by the patterned cover layers 60, as shown in FIG. 6. In addition, the patterned cover layers 60 may be dry films after exposure and development.

It is necessary to note that since a plurality of the through holes 13 can be formed in other embodiment, not only the insulation part 12 can have a plurality of through holes 13, but also each of the patterned cover layers 60 can have a plurality of openings 61 aligned with the through holes 13. In other words, each of the patterned cover layers 60 has at least one opening 61. Accordingly, the quantity of the opening 61 which each of the patterned cover layers 60 has is not limited to only one.

Figure 8:
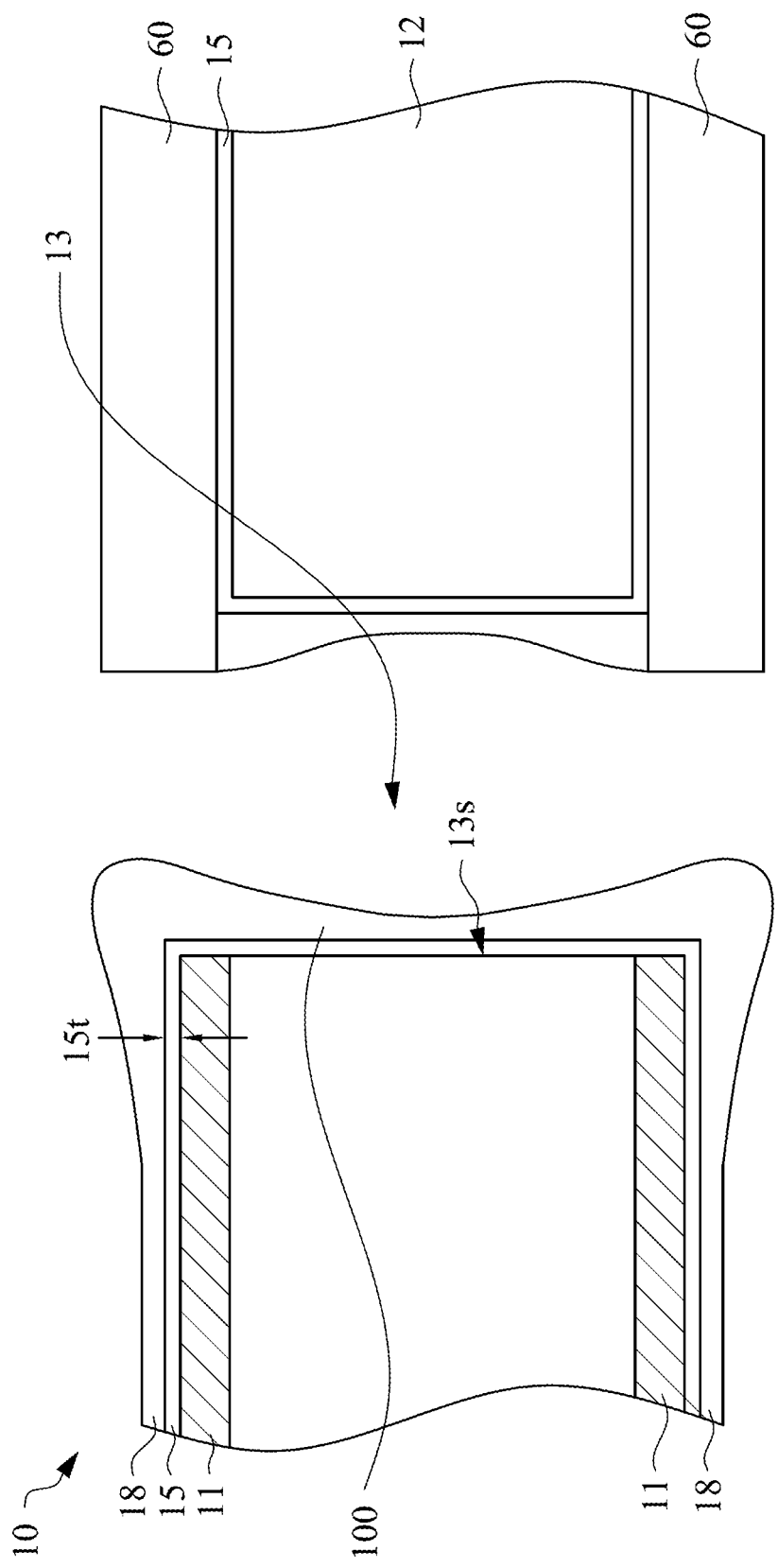

Referring to FIG. 8, afterwards, by using the patterned cover layers as masks, an electroplating process is performed to the wiring substrate 10 and the through hole 13. Specifically, before the patterned cover layers 60 are formed, the seed layer 15 has comprehensively covered the wiring substrate 10 and the sidewall 13s, so that an electric current can be applied to the seed layer 15 for electroplating process, so as to deposit metal in the regions that the patterned cover layers 60 do not cover, thereby forming the interlayer connective structure 100 in the through hole 13 and a metal layer 18 on each of the initial traces 11. As can be seen from FIG. 8, the interlayer connective structure 100 includes the part of the seed layer 15 in the through hole 13, where the initial traces 11 are located between the metal layers 18.

The electroplating process includes plating through hole (PTH) process, where the plating solution used by the electroplating process can include a low concentration of leveler or no leveler. The leveler contains a plurality of cations which are easy to coat a place with high negative charge density to obstruct the deposition of metal. Hence, the electroplating process using low concentration of leveler or no leveler can cause more metal to deposit at two end edges 13e (marked in FIG. 7) of the through hole 13.

Figure 9:
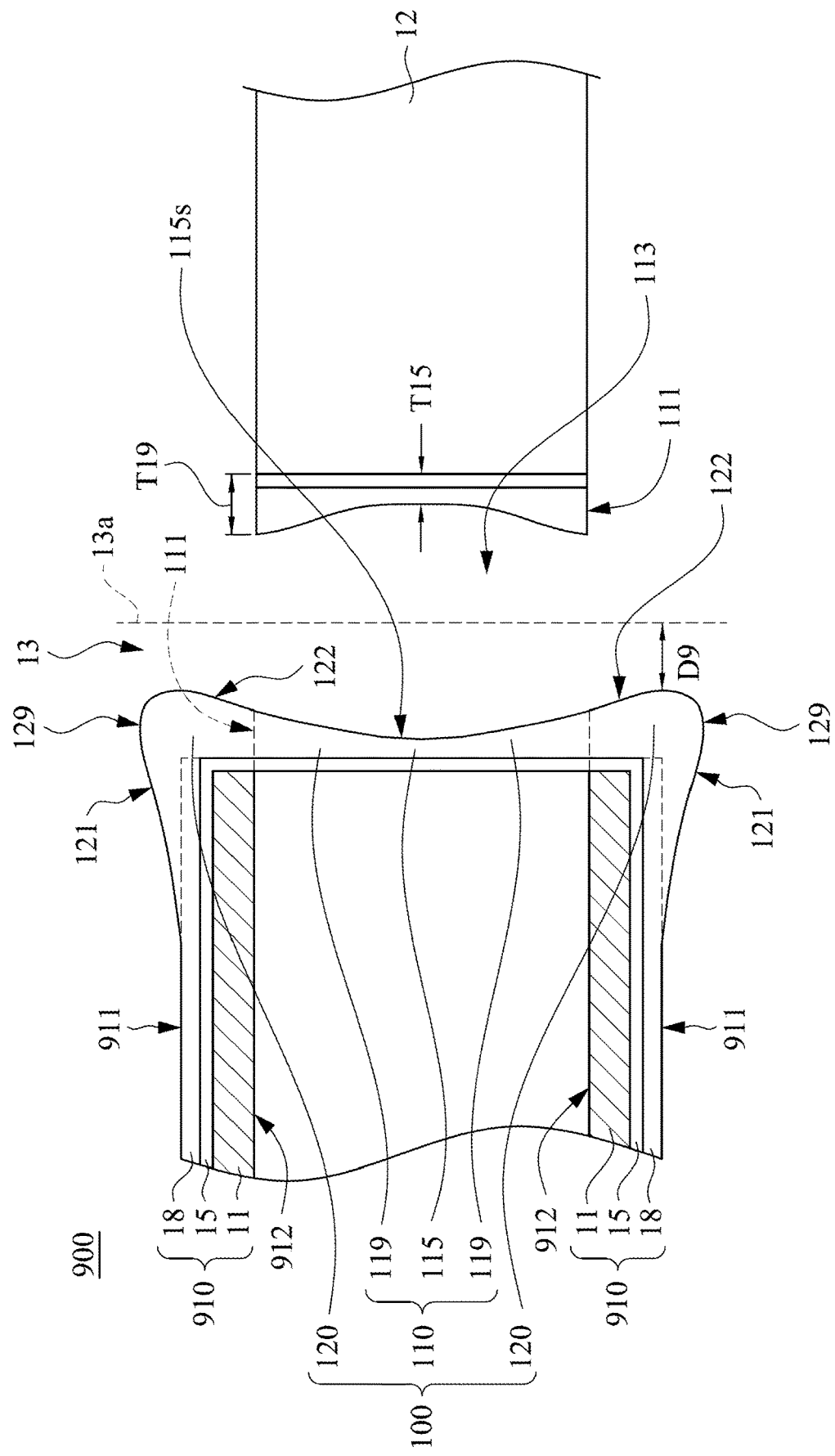

Referring to FIGS. 8 and 9, after performing the electroplating process, that is, after forming the interlayer connective structure 100, the patterned cover layers 60 are removed. After the patterned cover layers 60 are removed, the part of the seed layer 15 on the wiring substrate 10 is removed, while the other part of the seed layer 15 covered by the metal layer 18 and the interlayer connective structure 100 remains, where the remaining seed layer 15 is located on the sidewall 13s and the wiring layers (e.g., initial traces 11). At this time, a wiring board 900 including the insulation part 12, the interlayer connective structure 100, and a plurality of traces 910 (in which FIG. 9 shows two traces 910) is basically complete, where each of the traces 910 includes the initial trace 11, the metal layer 18, and the part of the seed layer 15, and the part of the seed layer 15 is located between the initial trace 11 and the metal layer 18.

Removing the part of the seed layer 15 can include micro-etching. The micro-etching is usually wet etching, so that not only the part of the seed layer 15 can be removed, but also the part of the interlayer connective structure 100 can be removed during the micro-etching. However, the thickness 15t of the seed layer 15 is significantly thin (e.g., between 0.2 µm and 1.2 µm), and the etched thickness of the micro-etching ranges about between 0.2 µm and 0.6 µm, for example. Hence, the thicknesses and the appearances of both the interlayer connective structure 100 and the metal layer 18 basically do not change significantly after micro-etching. In other words, the thicknesses and the appearances of both the interlayer connective structure 100 and the metal layer 18 are not affected basically by micro-etching.

Figure 10A:
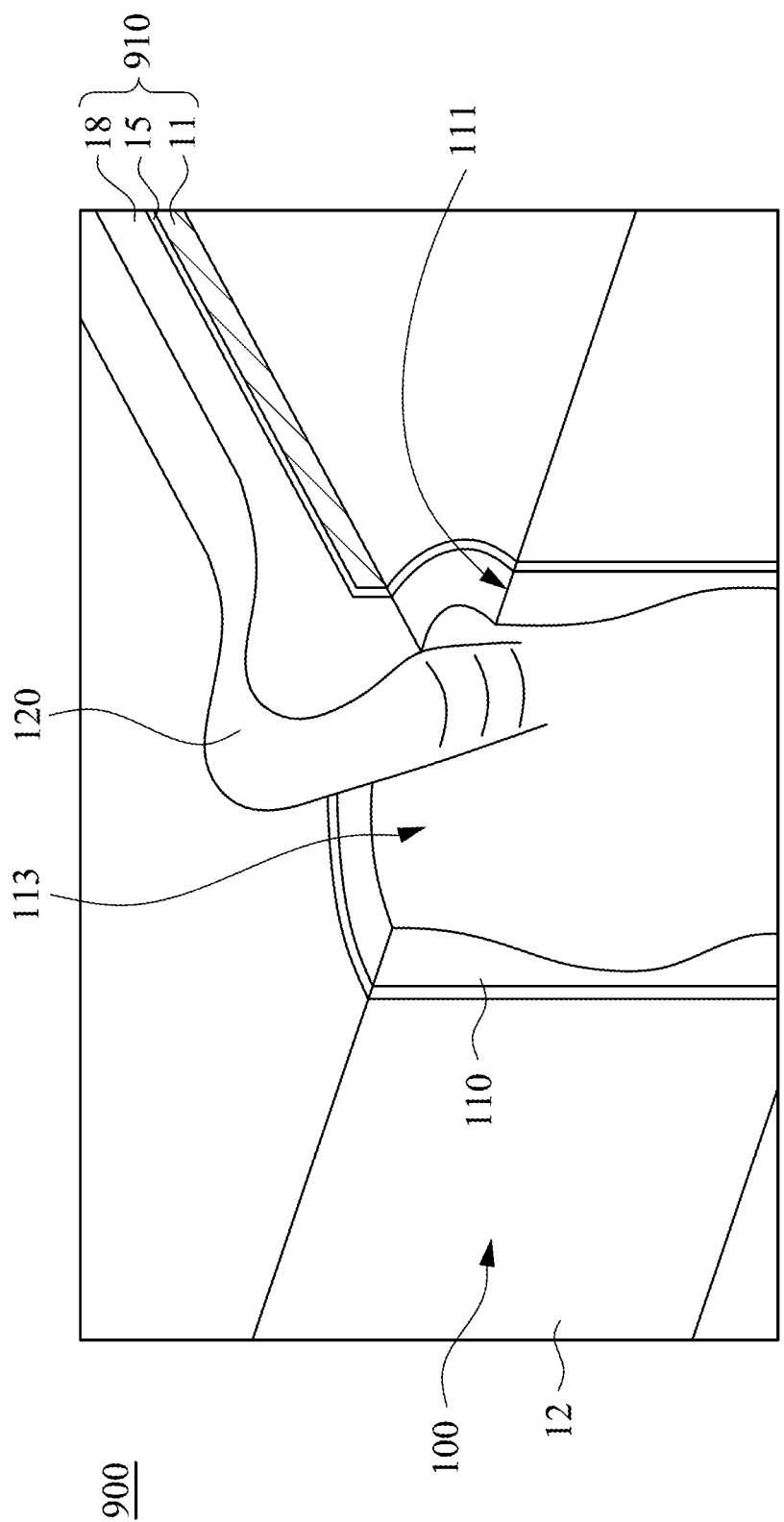
FIG. 10A is a schematic perspective view of the wiring board with its cross-section in FIG. 9.

FIG. 10A is a schematic perspective view of the wiring board with its cross-section in FIG. 9, where FIG. 10A illustrates a through via 113 and the traces 910 with a cross-section apiece, so that FIG. 10A can show the inner structure of the through via 113, the initial trace 11, the seed layer 15, and the metal layer 18 of the trace 910. In addition, the trace 910 in FIG. 10A has the cross-section parallel to the extension direction of the trace 910.

Referring to FIGS. 9 and 10A, in the wiring board 900, the insulation part 12 is located between the traces 910, while the interlayer connective structure 100 suitable for being formed in the wiring board 900 connects the traces 910 and includes the column 110 and a pair of protuberant parts 120. In order to show the column 110, the protuberant parts 120, and the traces 910 in FIG. 9 clearly, FIG. 9 shows boundaries among the column 110, the protuberant parts 120, and the traces 910 with dashed lines. It is necessary to note that the dashed lines shown in FIG. 9 are virtual auxiliary lines, and the boundaries among the column 110, the protuberant parts 120, and the traces 910 do not appear apparently in fact.

The column 110 is located in the through hole 13 and has two opposite end faces 111. The protuberant parts 120 are located at two ends of the through hole 13 and connected to the end faces 111 and the traces 910 respectively. Thus, the column 110 is located between the protuberant parts 120, and the protuberant part 120 sticks out from the end face 111 in any end of the through hole 13. Moreover, since the interlayer connective structure 100 includes the part of the seed layer 15 in the through hole 13, the column 110 and the protuberant parts 120 include the part of the seed layer 15 apiece, as shown in FIG. 9.

In the embodiment, the interlayer connective structure 100 can be hollow. Specifically, the column 110 can have a tubular shape and the through via 113, in which both the through via 113 and the through hole 13 can be substantially coaxial. The column 110 includes a pair of end-parts 119 and a central section 115, where the central section 115 is connected between the end-parts 119. The end-parts 119 have the end faces 111 respectively, so that the end-parts 119 are connected to the protuberant parts 120 respectively.

It is necessary to note that although the interlayer connective structure 100 can be hollow in the embodiment, the interlayer connective structure 100 can be solid in other embodiment. Specifically, the column 110 can be a solid metal pillar without the through via 113 in other embodiment. Hence, the interlayer connective structure 100 is not limited to being hollow. In addition, in other embodiment, the interlayer connective structure 100 can further include a filler filling the through via 113, such as ink, silver glue or copper paste.

The wall thickness T190 of each of the end-parts 119 may be larger than the wall thickness T15 of the central section 115, in which the wall thickness T15 shown in FIG. 9 can be the thinnest wall thickness of the column 110. In other words, the thinnest wall thickness (i.e., the wall thickness T15 shown in FIG. 9) of the column 110 is at the central section 115. Moreover, the wall thickness T19 of each of the end-parts 119 can decrease gradually from the end face 111 to the central section 115, as shown in FIG. 9. Hence, the through via 113 has an uneven diameter.

Each of the protuberant parts 120 has a convex curved surface 129. During the electroplating process for forming the interlayer connective structure 100, the plating solution including low concentration of or no leveler can be used to deposit more metal at two ends of the through hole 13. Accordingly, the protuberant parts 120 can be formed, and a distance D9 between the convex curved surface 129 and the axis 13a of the through hole 13 can be significantly smaller than the radius r13 of the through hole 13, where the radius r13 is equal to a half of the diameter R13 (referring FIG. 7).

Each of the traces 910 has an outer surface 911 and an inner surface 912. The inner surface 912 is connected to the insulation part 12, whereas the outer surface 911 is away from the insulation part 12, in which the protuberant parts 120 stick out from the outer surfaces 911 of the traces 910 respectively. Each of the protuberant parts 120 can further have a first curved surface 121 and a second curved surface 122. The first curved surface 121 extends from the convex curved surface 129 to the outer surface 911, whereas the second curved surface 122 extends from the convex curved surface 129 to the inner sidewall 115s of the central section 115, as shown in FIG. 9.

Figure 10B:
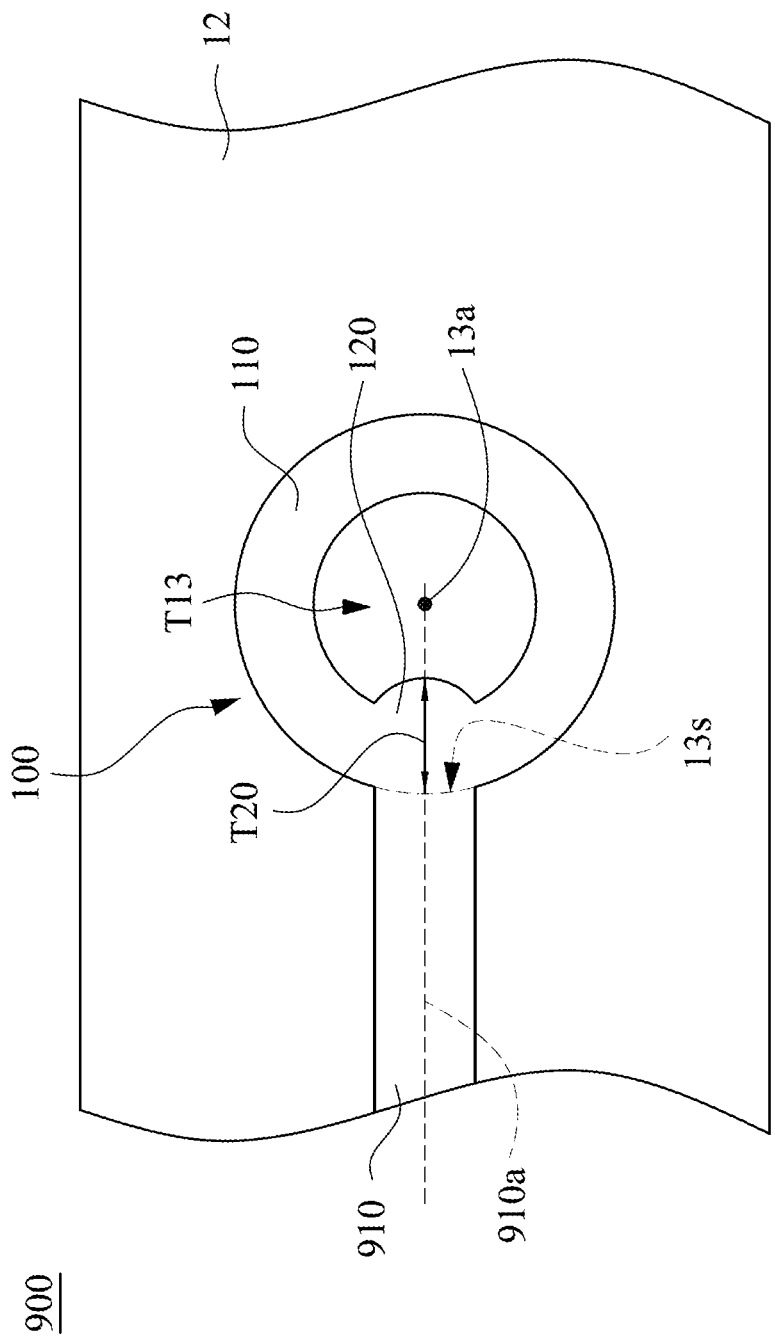
FIG. 10B is a schematic top view of the wiring board in FIG. 9.
Figure 10C:
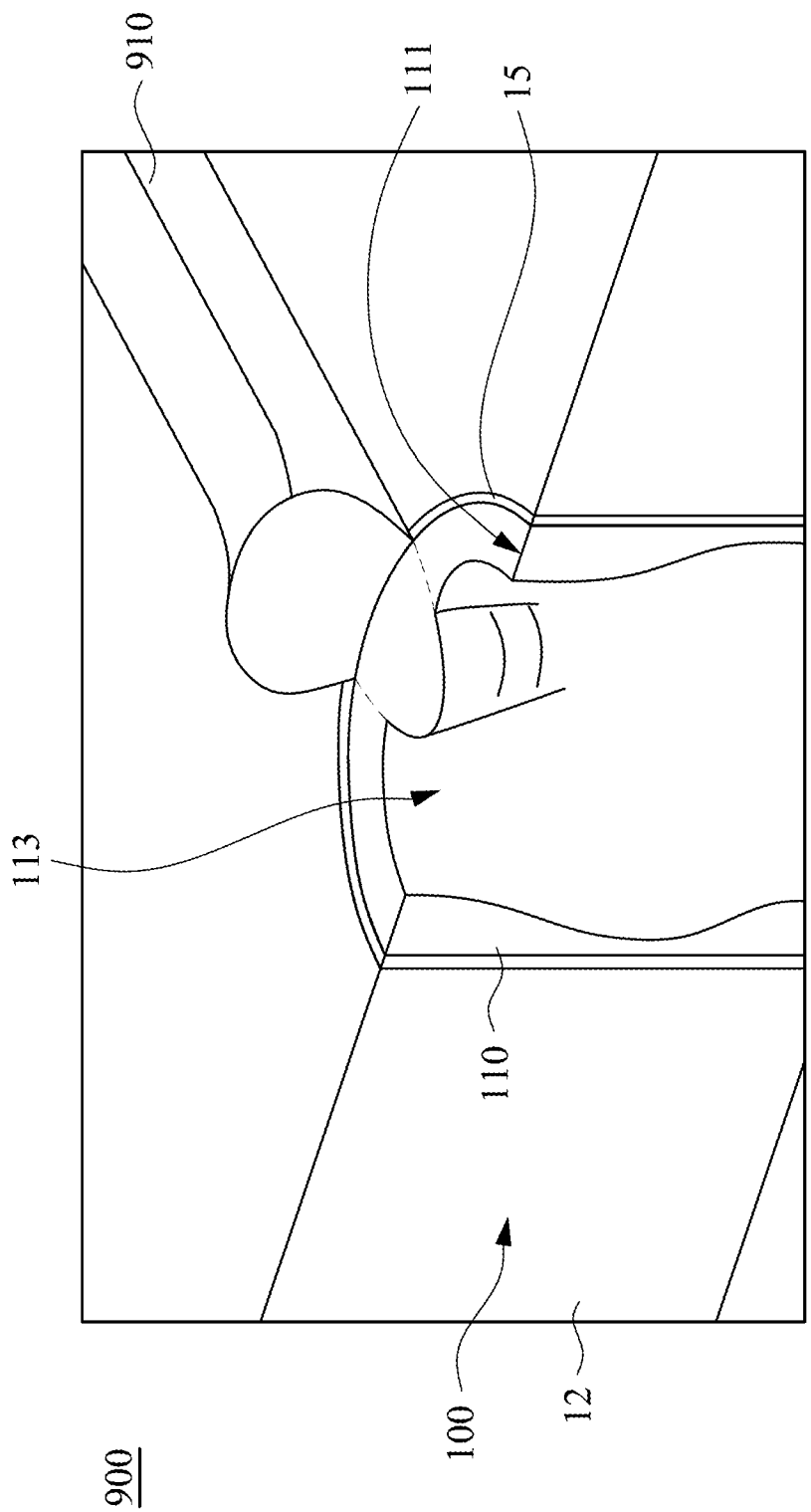
FIG. 10C is a schematic perspective view of the wiring board with its cross-section in FIG. 10A.

FIG. 10B is a schematic top view of the wiring board in FIG. 9, and FIG. 10C is a schematic perspective view of the wiring board with its cross-section in FIG. 10A, in which FIG. 10C has cross-sections along the end face 111 and the sidewall of the seed layer 15 respectively, and FIG. 10C is drawn by removing the part of the protuberant part 120 directly above the end face 111. Hence, in FIG. 10C, most of the protuberant part 120 is omitted, and the remaining protuberant part 120 is not marked in FIG. 10C.

Referring to FIGS. 10B and 10C, each of the traces 910 further has a long axis 910a, in which FIG. 9 can be a schematic cross-sectional view along the long axis 910a in FIG. 10B, and the long axis 910a can substantially pass through the axis 13a. In addition, the trace 910 shown in FIG. 10A has the cross-section which can be drawn along a direction parallel to the long axis 910a, so as to show the initial trace 11, the seed layer 15, and the metal layer 18 of the trace 910.

It can be understood from FIG. 10B that the wall thickness T20 of each of the protuberant parts 120 relative to the sidewall 13s can decrease gradually from the long axis 910a and along the sidewall 13s in a direction away from the long axis 910a, as shown in FIG. 10B.

Figure 10D:
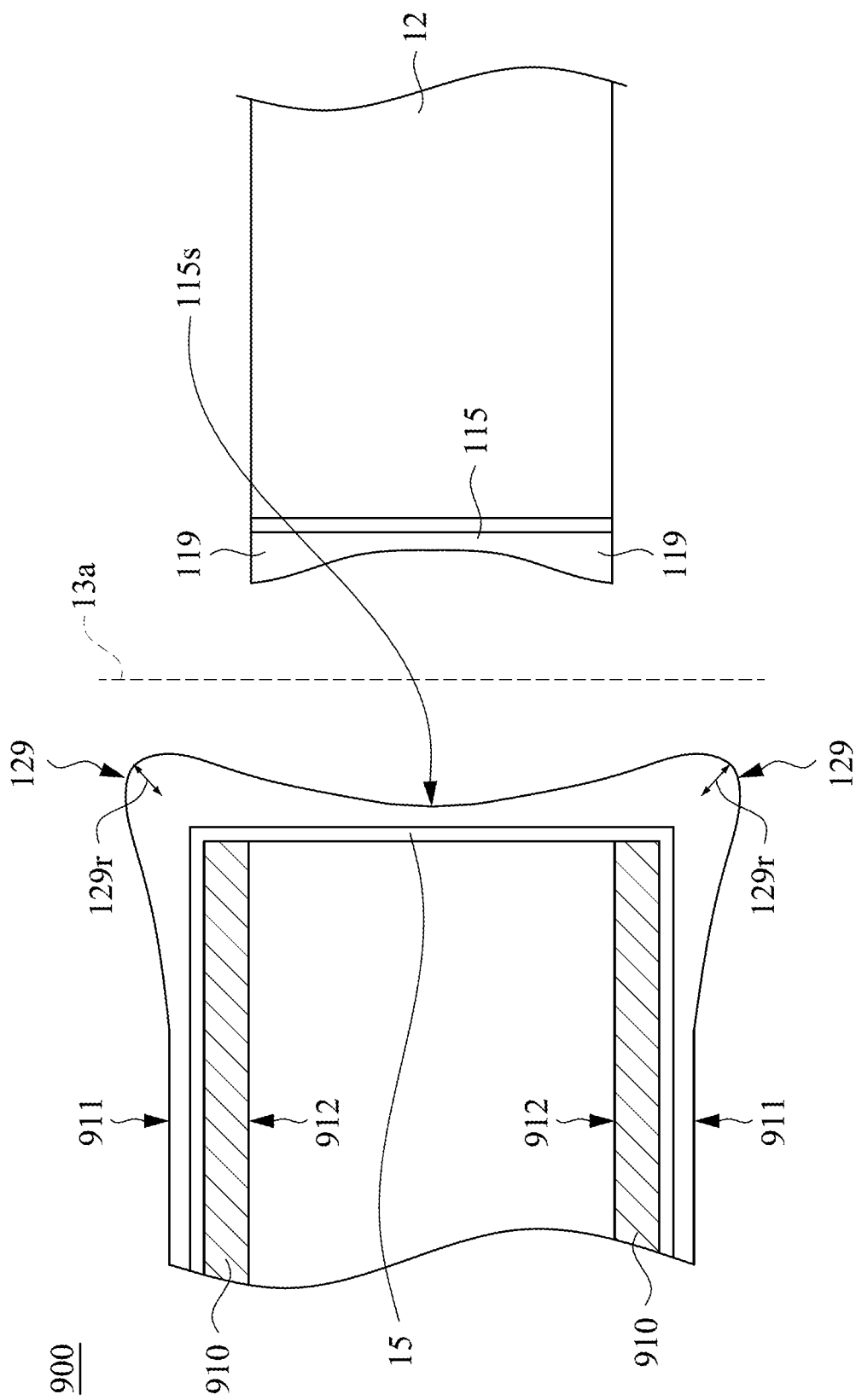
FIG. 10D is a schematic cross-sectional view of the wiring board in FIG. 10B.

FIG. 10D is a schematic cross-sectional view of the wiring board in FIG. 10B, in which FIG. 10D is drawn along the long axis 910a in FIG. 10B. Referring to FIG. 10D, in the interlayer connective structure 100, the convex curved surface 129 has a radius of curvature 129r, which may be larger than or equal to 3 µm. Hence, the protuberant parts 120 of the interlayer connective structure 100 have a enough thickness apiece, so that the interconnection between the interlayer connective structure 100 and the traces 910 has a significantly structure strength, thereby efficiently reducing or preventing the crack occurring. In addition, it can be apparent from the cross-sectional view shown in FIG. 10D that the radius of curvature 129r, the axis 13a, and the long axis 910a are all coplanar.

It is worth mentioning that the interlayer connective structure 100 disclosed in the previous embodiment can be a conductive through hole structure. However, in other embodiment, the interlayer connective structure 100 also can be a conductive buried hole structure. Specifically, the wiring board 900 can be a semi-finished product of the wiring board, and in the following process, a plurality of the wiring layers can be made on two opposite sides of the wiring board 900, in which the wiring layers can be made by buildup. In the process of manufacturing the wiring layers, two ends of the interlayer connective structure 100 can be covered by two insulation layers respectively, in which the insulation layer can be made of prepreg. Accordingly, the interlayer connective structure 100 can be buried inside the wiring board, thereby forming the conductive buried hole structure.

Consequently, the interlayer connective structure provided by at least one of the embodiments of the disclosure includes a pair of protuberant parts at two ends of the through hole. The protuberant parts stick out from the outer surfaces of the traces, and the distance between the convex curved surface of each of the protuberant parts and the axis of the through hole is less than the radius of the through hole, so that the interlayer connective structure has a significantly thick at each protuberant part. Therefore, the protuberant parts can enhance the structure of the interconnection between the interlayer connective structure and the trace, so as to reduce or prevent the crack occurring, thereby maintaining or improving the reliability.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An interlayer connective structure of a wiring board, suitable for being formed in the wiring board, wherein the wiring board comprises two traces and an insulation part between the traces, the insulation part has a through hole, and the interlayer connective structure located in the through hole is connected to the traces, wherein the interlayer connective structure comprises:
   a column, located in the through hole and having two opposite end faces; and
   a pair of protuberant parts, connected to the end faces and the traces respectively, and located at two ends of the through hole respectively, wherein each of the traces has an inner surface connected to the insulation part and an outer surface away from the insulation part, wherein the protuberant parts stick out from the outer surfaces of the traces respectively, each of the protuberant parts has a convex curved surface, and a distance between the convex curved surface and an axis of the through hole is less than a radius of the through hole;
   wherein each of the traces further has a long axis, and the through hole has a sidewall, wherein a wall thickness of each of the protuberant parts relative to the sidewall decreases gradually from the long axis and along the sidewall in a direction away from the long axis.

2. The interlayer connective structure of claim 1, wherein the convex curved surface has a radius of curvature, and the radius of curvature, the axis of the through hole, and the long axis of the trace are coplanar, wherein the radius of curvature is larger than or equal to 3 µm.

3. The interlayer connective structure of claim 2, wherein the column further has a tubular shape and a thinnest wall thickness.

4. The interlayer connective structure of claim 1, wherein the column comprises:
   a pair of end-parts, having the end face respectively; and
   a central section, connected between the end-parts, wherein a wall thickness of each of the end-parts is larger than a wall thickness of the central section.

5. The interlayer connective structure of claim 4, wherein the wall thickness of each of the end-parts decreases gradually from the end face to the central section.

6. The interlayer connective structure of claim 4, wherein the column further has a thinnest wall thickness, and the thinnest wall thickness is located at the central section.

7. The interlayer connective structure of claim 4, wherein each of the protuberant parts further has:
   a first curved surface, extending from the convex curved surface to the outer surface; and
   a second curved surface, extending from the convex curved surface to an inner sidewall of the central section.

8. The interlayer connective structure of claim 1, wherein each of the protuberant parts further has a first curved surface, and the first curved surface extends from the convex curved surface to the outer surface.

* * * * *